(12) United States Patent
Sun

(10) Patent No.: US 9,691,440 B2
(45) Date of Patent: Jun. 27, 2017

(54) CONTROL METHOD FOR DATA RECEPTION CHIP

(71) Applicant: VIA Alliance Semiconductor Co., Ltd., Shanghai (CN)

(72) Inventor: Hongquan Sun, Beijing (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 14/969,421

(22) Filed: Dec. 15, 2015

(65) Prior Publication Data

US 2017/0154654 A1    Jun. 1, 2017

(30) Foreign Application Priority Data

Nov. 26, 2015  (CN) .......................... 2015 1 0837623

(51) Int. Cl.
| | | |
|---|---|---|
| *G11C 5/14* | (2006.01) | |
| *G11C 11/4074* | (2006.01) | |
| *G05F 3/20* | (2006.01) | |
| *G05F 3/30* | (2006.01) | |
| *G05F 3/26* | (2006.01) | |
| *G11C 11/4096* | (2006.01) | |

(52) U.S. Cl.
CPC .............. *G11C 5/147* (2013.01); *G05F 3/205* (2013.01); *G05F 3/265* (2013.01); *G05F 3/30* (2013.01); *G11C 5/14* (2013.01); *G11C 11/4074* (2013.01); *G11C 11/4096* (2013.01)

(58) Field of Classification Search
CPC ....... G11C 5/147; G11C 5/14; G11C 11/4074; G11C 11/4096; G05F 3/265; G05F 3/30; G05F 3/205
See application file for complete search history.

(56) References Cited

U.S. PATENT DOCUMENTS

| | | | |
|---|---|---|---|
| 6,278,312 B1* | 8/2001 | Dabral ................. | H04L 25/062 327/180 |
| 9,418,726 B1* | 8/2016 | Sun ...................... | G11C 11/4099 |
| 2005/0024251 A1* | 2/2005 | Harada ................ | H03M 1/1225 341/163 |

(Continued)

OTHER PUBLICATIONS

European Search Report dated Apr. 11, 2017, issued in application No. 15200336.4-1805.

*Primary Examiner* — Toan Le
(74) *Attorney, Agent, or Firm* — McClure, Qualey & Rodack, LLP

(57) ABSTRACT

A control method for a data reception chip. The data reception chip includes a voltage generation module including a plurality of resistors and a selection unit. The resistors are connected in series with one another and divide an operation voltage to generate a plurality of divided voltages. The selection unit selects one of the divided voltages as a reference voltage according to a control signal. The control method includes controlling the selection unit to set the level of the reference voltage to an initial level; receiving data and comparing the data with the reference voltage to generate a compared result; determining whether the compared result is equal to pre-determined data; and directing the selection unit to select another divided voltage when the compared result is not equal to the pre-determined data.

7 Claims, 10 Drawing Sheets

(56) References Cited

U.S. PATENT DOCUMENTS

| | | |
|---|---|---|
| 2006/0181303 A1* | 8/2006 | Dreps ................. G06F 13/4072 326/29 |
| 2010/0188916 A1 | 7/2010 | Fox et al. |
| 2011/0141827 A1 | 6/2011 | Mozak et al. |
| 2013/0257379 A1 | 10/2013 | Kato et al. |
| 2014/0368238 A1* | 12/2014 | Song ................ G11C 29/12005 327/108 |
| 2015/0095668 A1* | 4/2015 | Choi ........................ G05F 1/56 713/300 |
| 2016/0259359 A1* | 9/2016 | Kim ......................... G05F 3/16 |

* cited by examiner

US 9,691,440 B2

CONTROL METHOD FOR DATA RECEPTION CHIP

CROSS REFERENCE TO RELATED APPLICATIONS

This Application claims priority of China Patent Application No. 201510837623.9, filed on Nov. 26, 2015, the entirety of which is incorporated by reference herein.

BACKGROUND OF THE INVENTION

Field of the Invention

The invention relates to a data reception chip, and more particularly to a data reception chip is capable of generating a reference voltage.

Description of the Related Art

Generally, memories comprise read only memories (ROMs) and random access memories (RAMs). Common types of ROM include programmable ROMs (PROMs), erasable PROMs (EPROMs), electrically EPROMs (EE-PROMs), and flash memories. Common types of RAM include static RAMs (SRAMs) and dynamic RAMs (DRAMs).

A data reception chip is utilized to access memories. However, when the data reception chip accesses a memory, if the data reception chip receives an external signal, the accessing operation may easily be interfered with by external noise led into the data reception chip by the external signal, affecting the accuracy of the data received by the data reception chip.

BRIEF SUMMARY OF THE INVENTION

In accordance with an embodiment, a control method for a data reception chip. The data reception chip comprises a voltage generation module comprising a plurality of resistors and a selection unit. The resistors are connected in series with one another and divide an operation voltage to generate a plurality of divided voltages. The selection unit selects one of the divided voltages as a reference voltage according to a control signal. The control method comprises controlling the selection unit to set the level of the reference voltage to an initial level; receiving data and comparing the data with the reference voltage to generate a compared result; determining whether the compared result is equal to pre-determined data; and directing the selection unit to select another divided voltage when the compared result is not equal to the pre-determined data.

The reference voltage generated by the data reception chip of the invention is capable of tracking the change of received signal to reduce the error rate. In other embodiments, the number of pins on the data reception chip is reduced.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
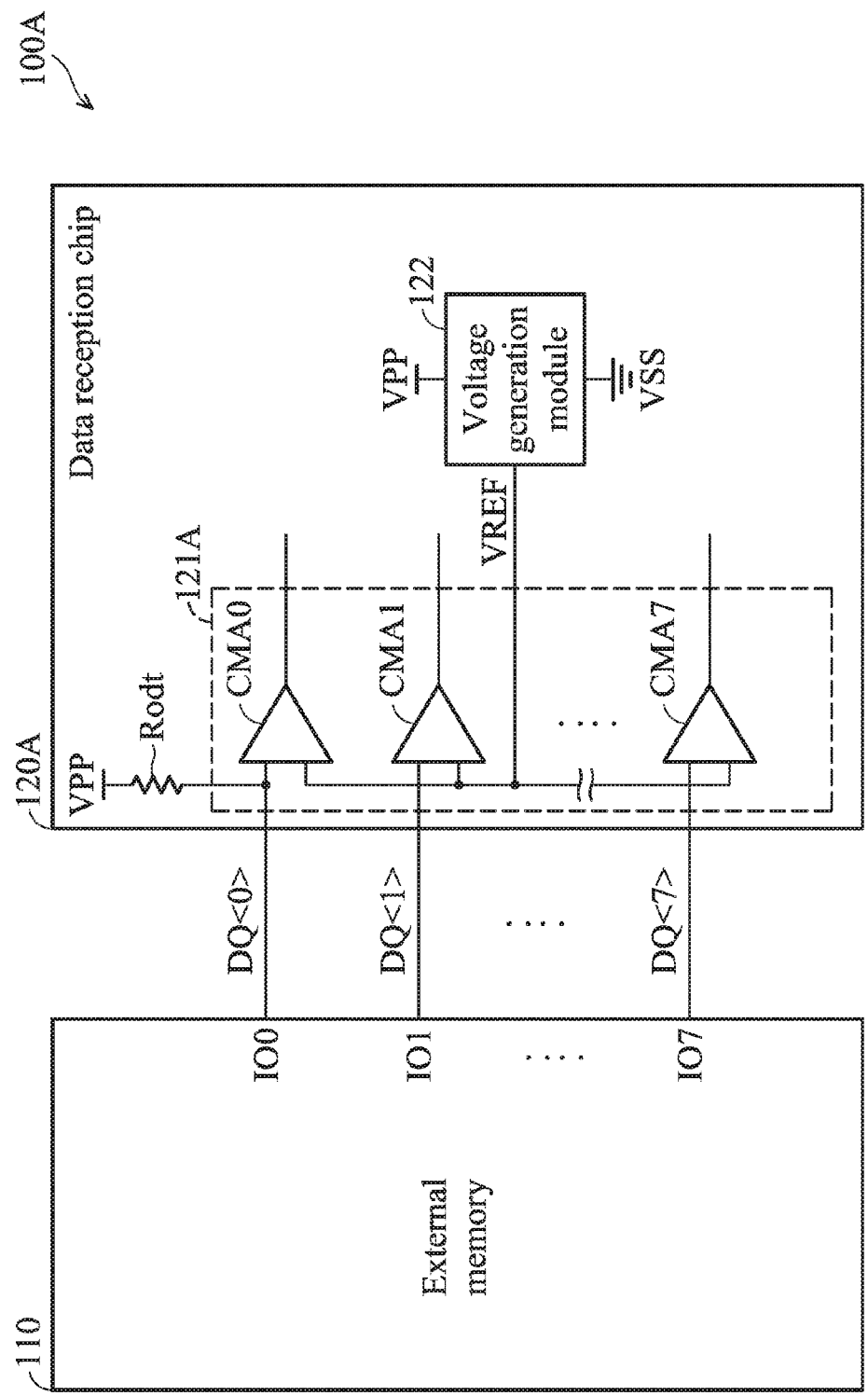
FIGS. 1A and 1B are schematic diagrams of exemplary embodiments of a control system, according to various aspects of the present disclosure.

FIG. 1A is a schematic diagram of an exemplary embodiment of a control system, according to various aspects of the present disclosure. The control system 100A comprises an external memory 110 and a data reception chip 120A. The external memory 110 may be a non-volatile memory or a volatile memory. In one embodiment, the external memory 110 is a dynamic random access memory (DRAM), but the disclosure is not limited thereto. As shown in FIG. 1A, while the external memory 110 comprises input-output pins IO0~IO7, it should be appreciated that the number of input-output pins need not be limited to eight, but may be greater or fewer in number in other embodiments. The input-output pins IO0~IO7 transmit data DQ<0>~DQ<7>, respectively.

The data reception chip 120A is coupled to the external memory 110 and operates according to operation voltages VPP and VSS. In one embodiment, the data reception chip 120A is a memory controller. In this embodiment, the data reception chip 120A comprises a comparison module 121A and a voltage generation module 122. While the comparison module 121A comprises comparators CMA0~CMA7, it should be appreciated that the number of comparators need not be limited to eight, but may be greater or fewer in number in other embodiments. The comparators CMA0~CMA7 are coupled to the input-output pins IO0~IO7 to receive the data DQ<0>~DQ<7>, respectively. The comparators CMA0~CMA7 compare the data DQ<0>~DQ<7> with a reference voltage VREF to identify the values of the DQ<0>~DQ<7>, respectively. For example, when the data DQ<0> is greater than the reference voltage VREF, it means that the value of the data DQ<0> is 1. On the contrary, when the data DQ<0> is less than the reference voltage VREF, it means that the value of the data DQ<0> is 0.

In this embodiment, the comparators CMA0~CMA7 receive the same reference voltage VREF, but the disclosure is not limited thereto. In other embodiments, the reference voltage received by at least one of the comparators CMA0~CMA7 is different from the reference voltage received by one of the rest of the comparators CMA0~CMA7.

To compensate for the equivalent resistance of each of the transmission lines between the comparator module 121A and the input-output pins IO0-IO7, the data reception chip 120A comprises a plurality of terminal resistors in this embodiment. Each terminal resistor is coupled to a comparator and receives the operation voltage VPP. For brevity, FIG. 1A only shows a single terminal resistor Rodt. The terminal resistor Rodt is coupled to the first input terminal of the comparator CMA0, wherein the first input terminal of the comparator CMA0 further receives the data DQ<0>. In other embodiments, the terminal resistor Rodt can be omitted to reduce the element cost.

The voltage generation module 122 receives the operation voltages VPP and VSS and generates the reference voltage VREF according to the operation voltages VPP and VSS. The voltage generation module 122 is integrated into the data reception chip 120A so that no external noise is allowed into the data reception chip 120A. Furthermore, the data reception chip 120A does not utilize an additional pin to receive the reference voltage VREF, meaning that the size of the data reception chip 120A and the number of input-output pins of the data reception chip 120A can be reduced.

Figure 1B:
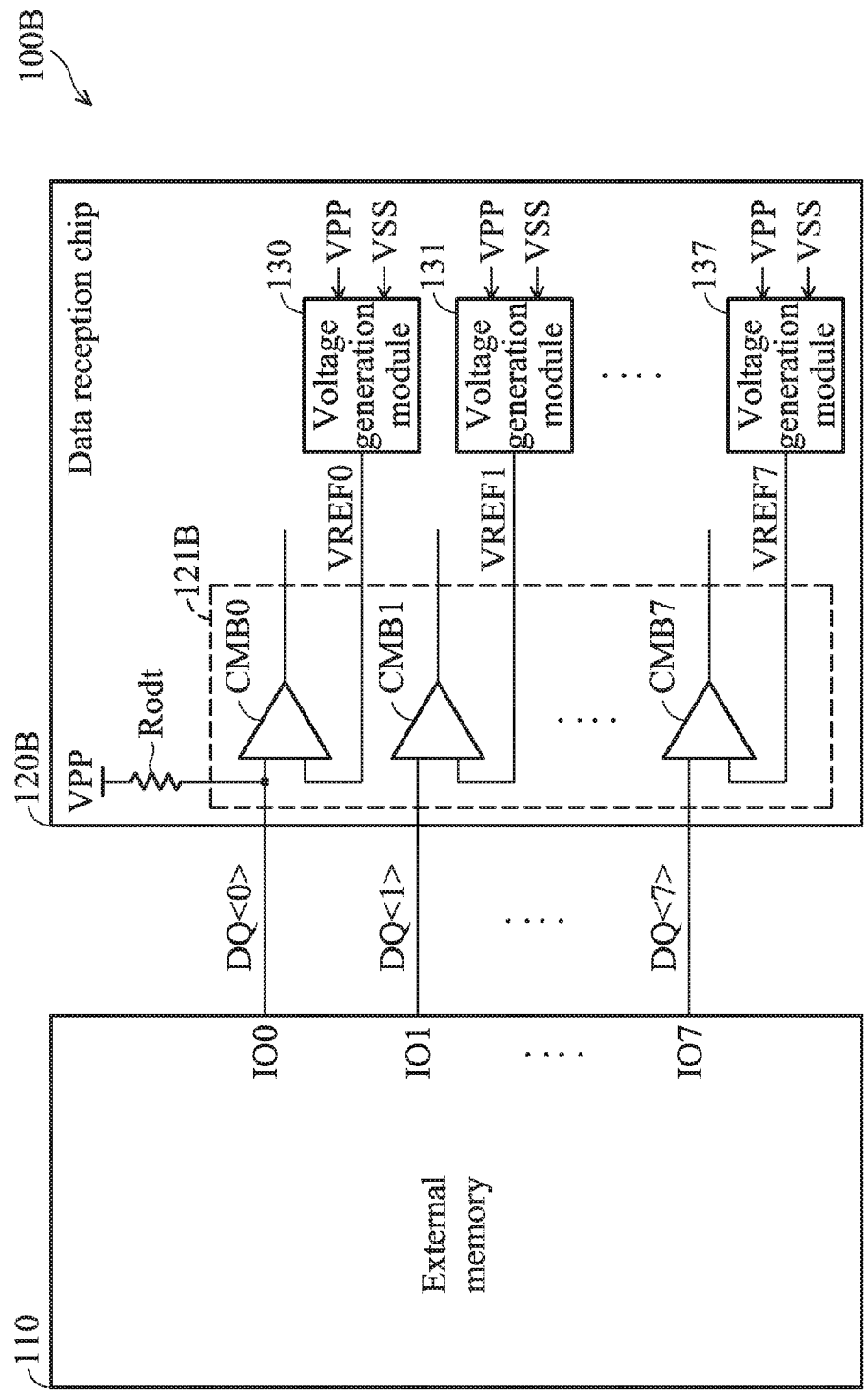

In this embodiment, the comparators CMA0~CMA7 receive the same reference voltage VREF generated by a single voltage generation module, such as 122, but the disclosure is not limited thereto. FIG. 1B is a schematic diagram of another exemplary embodiment of a control system, according to various aspects of the present disclosure. FIG. 1B is similar to FIG. 1A with the exception that the data reception chip 120B comprises voltage generation modules 130~137. The voltage generation modules 130~137 generate reference voltages VREF0~VREF7, respectively. The comparators CMB0~CMB7 receive the reference voltages VREF0~VREF7, respectively.

The invention does not limit the number of voltage generation modules. In some embodiments, the data reception chip 120B comprises many voltage generation modules, and the number of voltage generation modules may be 2 or more. In one embodiment, the number of voltage generation modules is the same as the number of comparators. In another embodiment, the number of voltage generation modules is less than the number of comparators. In this case, a voltage generation module may provide a reference voltage to a plurality of comparator. In some embodiments, at least one of the reference voltages VREF0~VREF7 is different from one of the remaining of the reference voltages VREF0~VREF7. In this case, a voltage, such as 0.5V, occurs between two different reference voltages. The above reference voltages are generated inside of the data reception chip, and they are approximately synchronized with the operation voltage VPP. The comparison module processes the received signal according to the operation voltage VPP. Therefore, the above reference voltages are capable of tracking the changes in the received signal so that the difference between the reference voltage and the received signal is maintained. Therefore, the data reception chip is capable of accurately determining the values of the received signal to reduce an error rate. In one embodiment, the operation voltage of the comparator module 121A is the operation voltage VPP. When the operation voltage is shifted, the compared result generated by the comparator module 121A is affected by the shifted operation voltage. However, since the reference voltage VREF tracks the change of the operation voltage, the shifted operation voltage can be compensated by the reference voltage VREF.

Figure 2A:
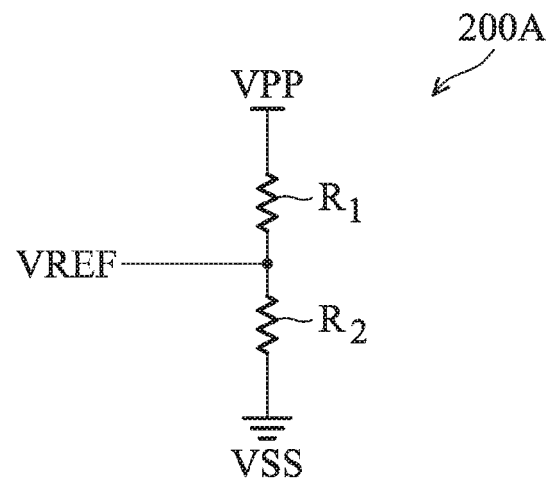
FIGS. 2A-2D and 3A-3D are schematic diagrams of exemplary embodiments of a voltage generation module, according to various aspects of the present disclosure.
Figure 2B:
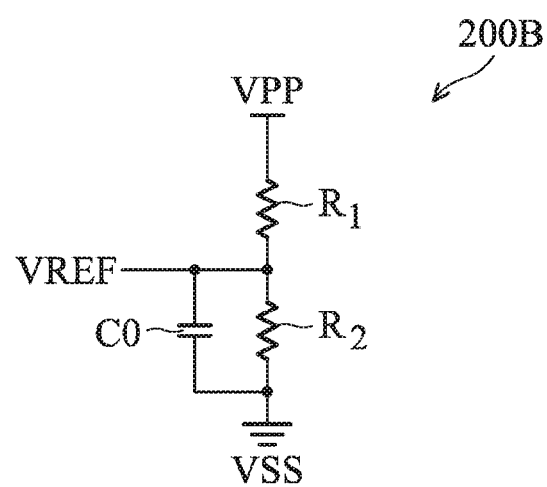
Figure 2C:
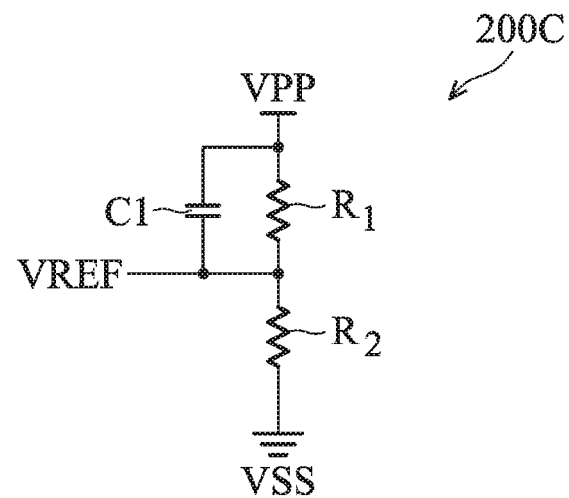
Figure 2D:
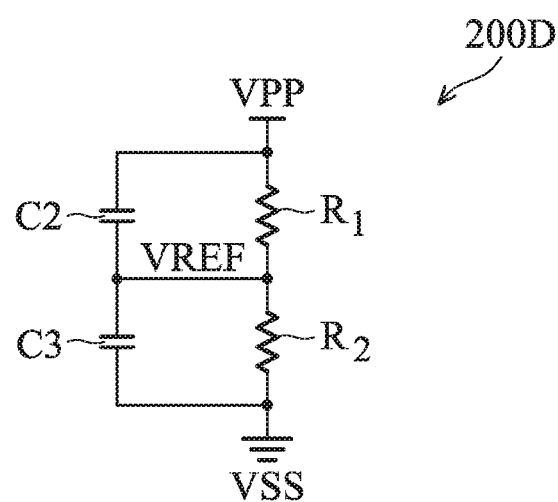

FIGS. 2A-2D are schematic diagrams of exemplary embodiments of a voltage generation module, according to various aspects of the present disclosure. In FIG. 2A, the voltage generation module 200A comprises resistors R1 and R2. The resistor R1 is serially connected to the resistor R2. The resistors R1 and R2 divide the operation voltage VPP to generate the reference voltage VREF. In FIG. 2B, the voltage generation module 200B comprises resistors R1~R2 and a capacitor C0. The resistor R1 is serially connected to the resistor R2 between the operation voltages VPP and VSS. The capacitor C0 is configured to filter the noise of the operation voltage VPP. In this embodiment, the capacitor C0 is connected to the resistor R2 in parallel to filter noise with a high frequency. In FIG. 2C, the voltage generation module 200C comprises a capacitor C1 and resistors R1~R2. The resistor R1 is connected to the resistor R2 in series between the operation voltages VPP and VSS. The capacitor C1 is configured to filter the noise of the operation voltage VSS. In this embodiment, the capacitor C1 is connected to the resistor R1 in parallel to filter noise with a high frequency. In FIG. 2D, the voltage generation module 200D comprises capacitors C2~C3 and resistors R1~R2. The resistor R1 is connected to the resistor R2 in series between the operation voltages VPP and VSS to generate the reference voltage VREF. The capacitors C2~C3 direct the reference voltage VREF to track the noise of the operation voltage VPP. In particular, the reference voltage VREF has a DC component and a AC component. The resistors R1 and R2 divide the operation voltage VPP to obtain the DC component. The AC component occurs only when the frequency of the noise in the circuit is high. When the frequency of the noise in the circuit is low, the AC component is zero. When the circuit has the noise with a high frequency, the capacitors C2 and C3 divide the operation voltage VPP to obtain the AC component. In this embodiment, when the circuit has the noise with a low frequency, the resistors R1 and R2 divide the operation voltage VPP to obtain the reference voltage VREF. When the circuit has the noise with the high frequency, the resistors R1 and R2 divide the operation voltage VPP to obtain the DC component of the reference voltage VREF, and the capacitors C2 and C3 divide the operation voltage VPP to obtain the AC component of the reference voltage VREF. The DC component and the AC component constitute the reference voltage VREF.

Figure 3A:
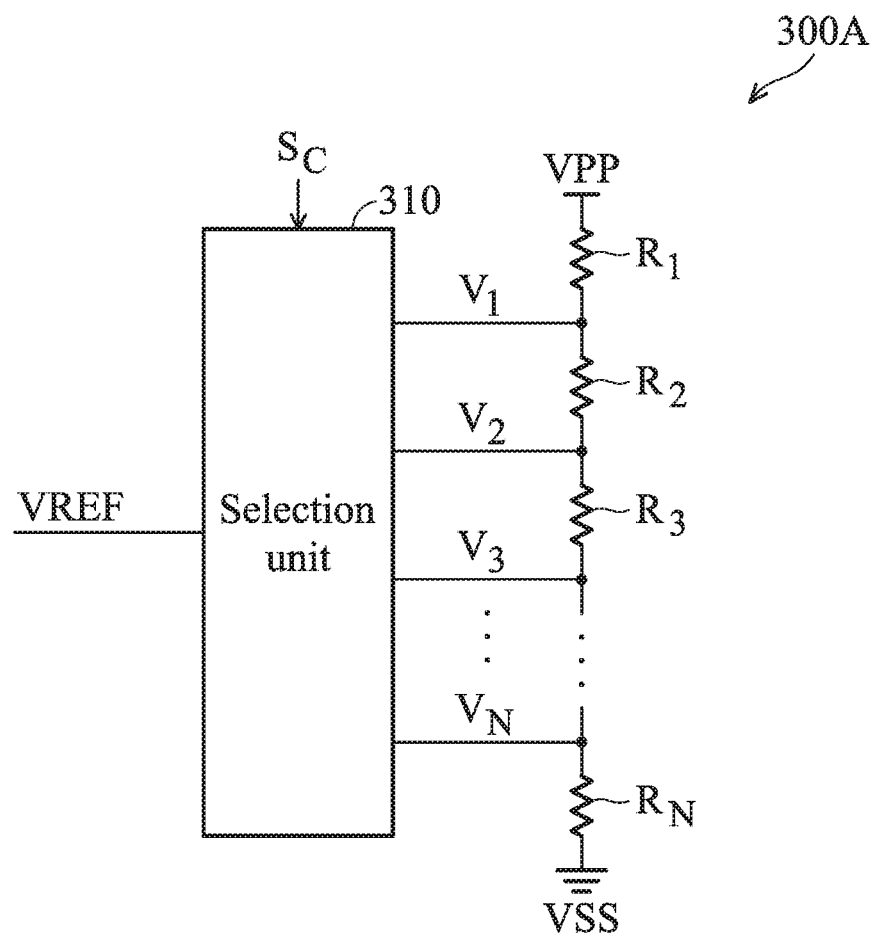

FIGS. 3A-3D schematic diagrams of exemplary embodiments of a voltage generation module, according to various aspects of the present disclosure. In FIG. 3A, the voltage generation module 300A comprises resistors R1~RN and a selection unit 310. The resistors R1~RN are connected to each other in series between the operation voltages VPP and VSS and divide the operation voltage VPP to generate divided voltages V1~VN. The selection unit 310 selects one of the voltages V1-VN to serve as the reference voltage VREF according to a control signal SC. The invention does not limit the resistance of the resistors R1-RN. In one embodiment, the resistors R1~RN each have the same resistance. In another embodiment, the resistance of at least one of the resistors R1~RN is different from one of the rest of the resistors R1~RN.

Figure 3B:
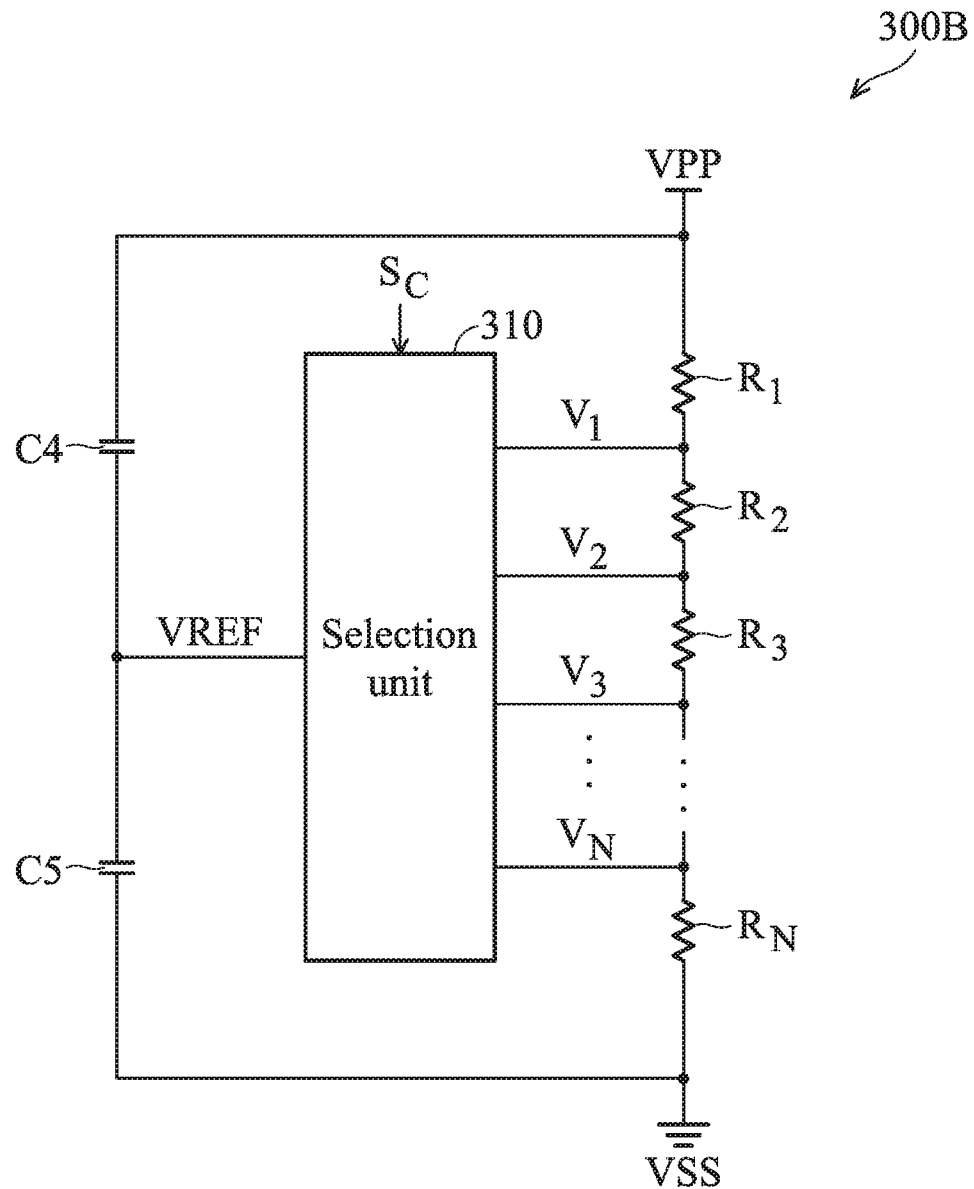

In FIG. 3B, the voltage generation module 300B is similar to the voltage generation module 300A, except that the voltage generation module 300B also comprises capacitors C4~C5. The capacitors C4~C5 are configured to direct the reference voltage VREF to track the noise of the operation voltage VPP. As shown in FIG. 3B, the capacitor C4 is coupled between the operation voltage VPP and the reference voltage VREF, and the capacitor C5 is coupled between the operation voltage VSS and the reference voltage VREF. In particular, the reference voltage VREF has a DC component and a AC component. The DC component can be obtain when the resistors divide the operation voltage VPP. The AC component occurs only when the circuit has the noise with a high frequency. When the circuit has the noise with a low frequency, the AC component is zero. When the circuit has the noise with the high frequency, the capacitors C4 and C5 divide the operation voltage VPP to obtain the AC component. In this embodiment, when the circuit has the noise with the low frequency, the resistors divide the operation voltage VPP to obtain the reference voltage VREF. When the circuit has the noise with the high frequency, the resistors divide the operation voltage VPP to obtain the DC component of the reference voltage VREF, and the capacitors C4 and C5 divide the operation voltage VPP to obtain the AC component of the reference voltage VREF. The DC component and the AC component constitute the reference voltage VREF.

Figure 3C:
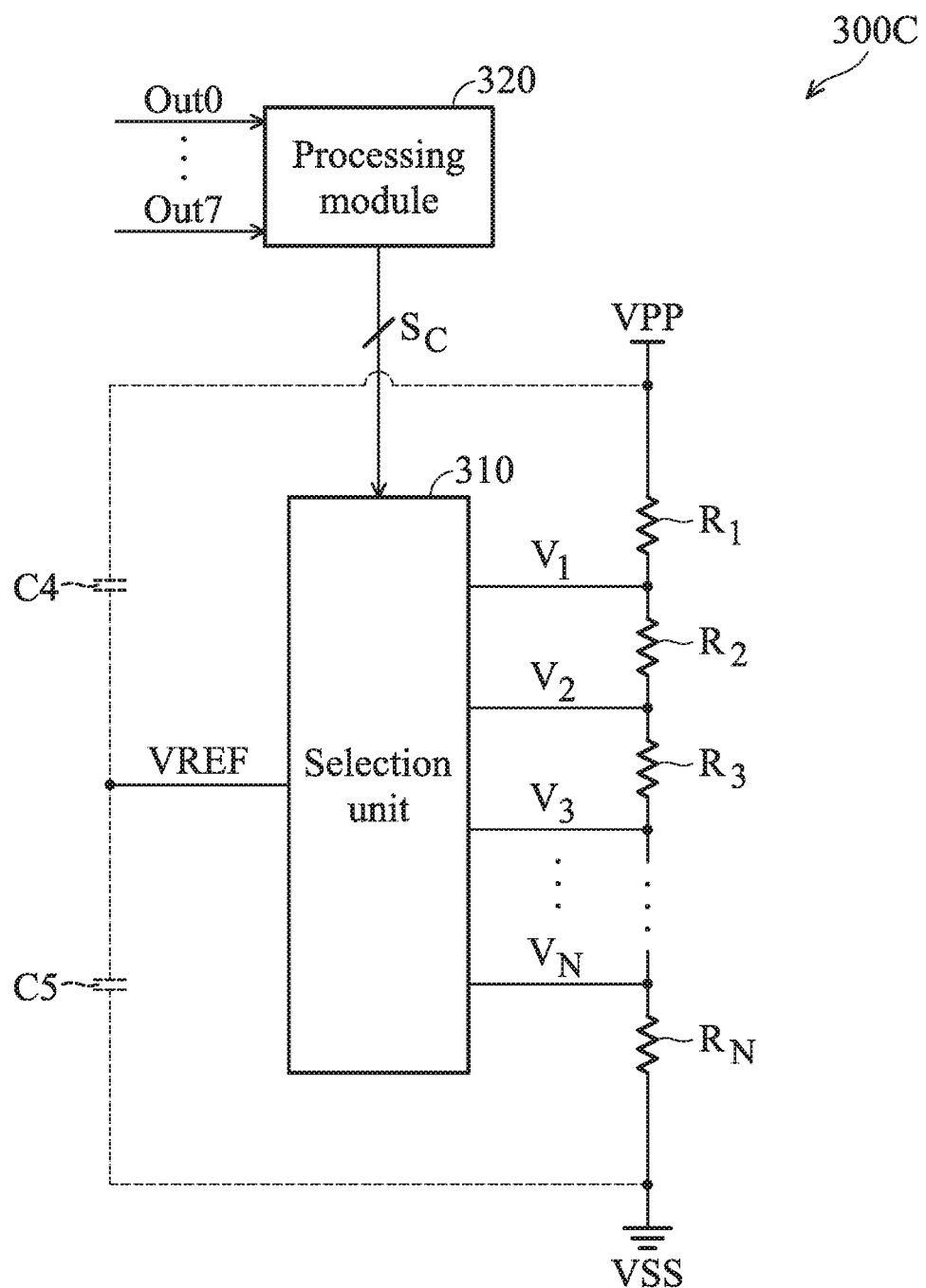

In FIG. 3C, the voltage generation module 300C is similar to the voltage generation module 300A except that the voltage generation module 300C comprises a processing module 320. The processing module 320 compares the compared results Out0~Out7 of the comparison module 121A or 121B shown in FIG. 1A or FIG. 1B with pre-determined data to determine whether the data received by the comparison module 121A or 121B are correct and then generates the control signal $S_C$ according to the determined results to adjust the reference voltage VREF. In one embodiment, the control signal $S_C$ is a digital signal.

Figure 3D:
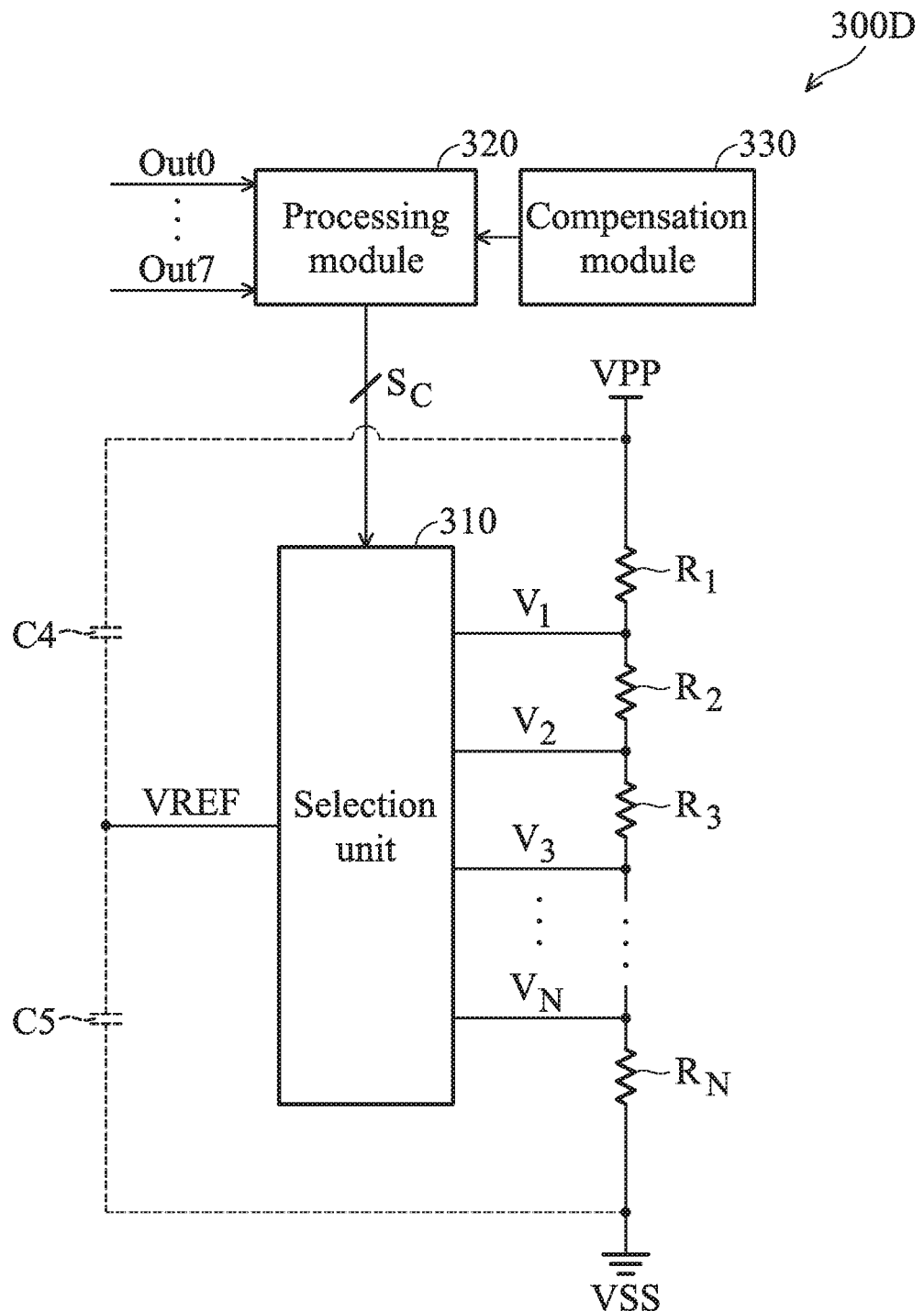
Figure 4:
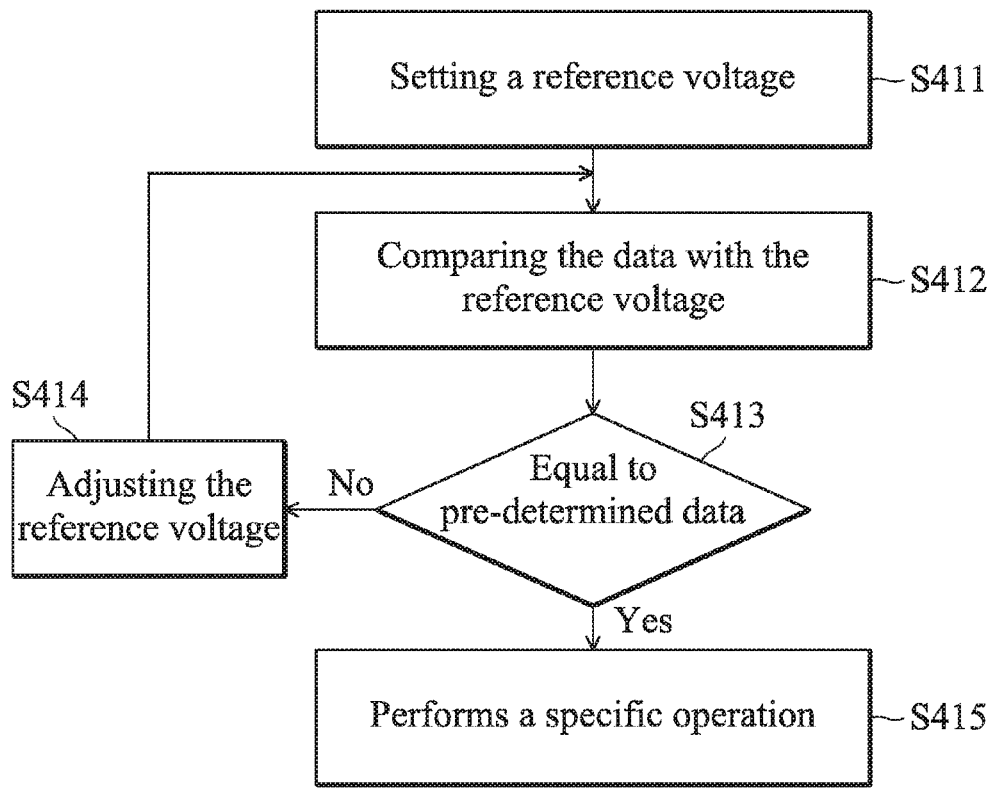
FIG. 4 is a flowchart of an exemplary embodiment of the voltage generation module shown in FIG. 3C.

FIG. 4 is a flowchart of a control method for the voltage generation module 300C shown in FIG. 3, according to various aspects of the present disclosure. First, the level of the reference voltage VREF is set to an initial level (step S411). In one embodiment, the processing module 320 outputs a pre-determined control signal $S_C$. The selection unit 310 selects a maximum level or a minimum level among the divided voltages $V_1$-$V_N$ as the initial level according to the pre-determined control signal $S_C$.

External data is received and compared with the reference voltage VREF (step S412). Taking FIG. 1A as an example, the comparator CMA0 receives the data DQ<0> and compares the data DQ<0> with the reference voltage VREF to identify the value of the data DQ<0>.

The processing module 320 determines whether the compared result (e.g. Out0) generated by the comparator CMA0 is equal to pre-determined data (step S413). When the compared result of the comparator CMA0 is not equal to the pre-determined data, it means that the reference voltage VREF is not appropriate. Therefore, the processing module 320 utilizes the control signal $S_C$ to increase or reduce the reference voltage VREF (step S414) and performs step S412 to continually compare the data DQ<0> with the increased or reduced reference voltage VREF.

When the compared result of the comparator CMA0 is still not equal to the pre-determined data, the processing module 320 continually utilizes the control signal $S_C$ to adjust the reference voltage VREF until the compared result of the comparator CMA0 is equal to the pre-determined data. When the compared result of the comparator CMA0 is equal to the pre-determined data, the processing module 320 performs a specific operation (step S415). In one embodiment, the specific operation is to direct the selection unit 310 to maintain the reference voltage VREF. In another embodiment, the specific operation is to perform step S414 to continually adjust the reference voltage VREF and compare the data DQ<0> with the adjusted reference voltage VREF. In this case, the processing module 320 determines whether some of the divided voltages $V_1$~$V_N$ are appropriate.

For example, assuming that when the reference voltage VREF is equal to 0.5 mV~0.8 mV, the compared result of the comparator CMA0 is equal to the pre-determined data. In one embodiment, the processing module 320 utilizes the control signal SC to maintain the reference voltage VREF within 0.5 mV~0.8 mV. In some embodiments, the processing module 320 calculates an average value, such as (0.5+0.8)/2, and then utilizes the control signal SC to fix the level of the reference voltage VREF at 0.65 mV, but the disclosure is not limited thereto. In other embodiments, the processing module 320 utilizes other calculation method to define an appropriate reference voltage VREF.

In some embodiments, each when the processing module 320 determines whether the compared result of the comparator CMA0 is equal to the pre-determined data, the processing module 320 records the determined result. Then, the processing module 320 defines an appropriate reference voltage VREF that can help the comparison module to correctly identify the values of the data DQ<0>~DQ<7>. In other embodiments, the processing module 320 utilizes the control signal $S_C$ to gradually increase or reduce the reference voltage VREF to fine the appropriate reference voltage VREF.

FIG. 3D is similar to FIG. 3C except that the voltage generation module 300D further comprises a compensation module 330. The compensation module 330 utilizes the processing module 320 to adjust the control signal SC according to at least one of the operation voltage VPP, the temperature and the operation time of the data reception chip, such as 120A or 120B. In other embodiments, the processing module 320 can be omitted. In this case, the compensation module 330 generates the control signal SC. In some embodiments, the compensation module 330 is integrated into the processing module 320. In one embodiment, the compensation module 330 is configured to track the changes of process, voltage and temperature and the aging of the elements within the data reception chip 120A or 120B.

Figure 5:
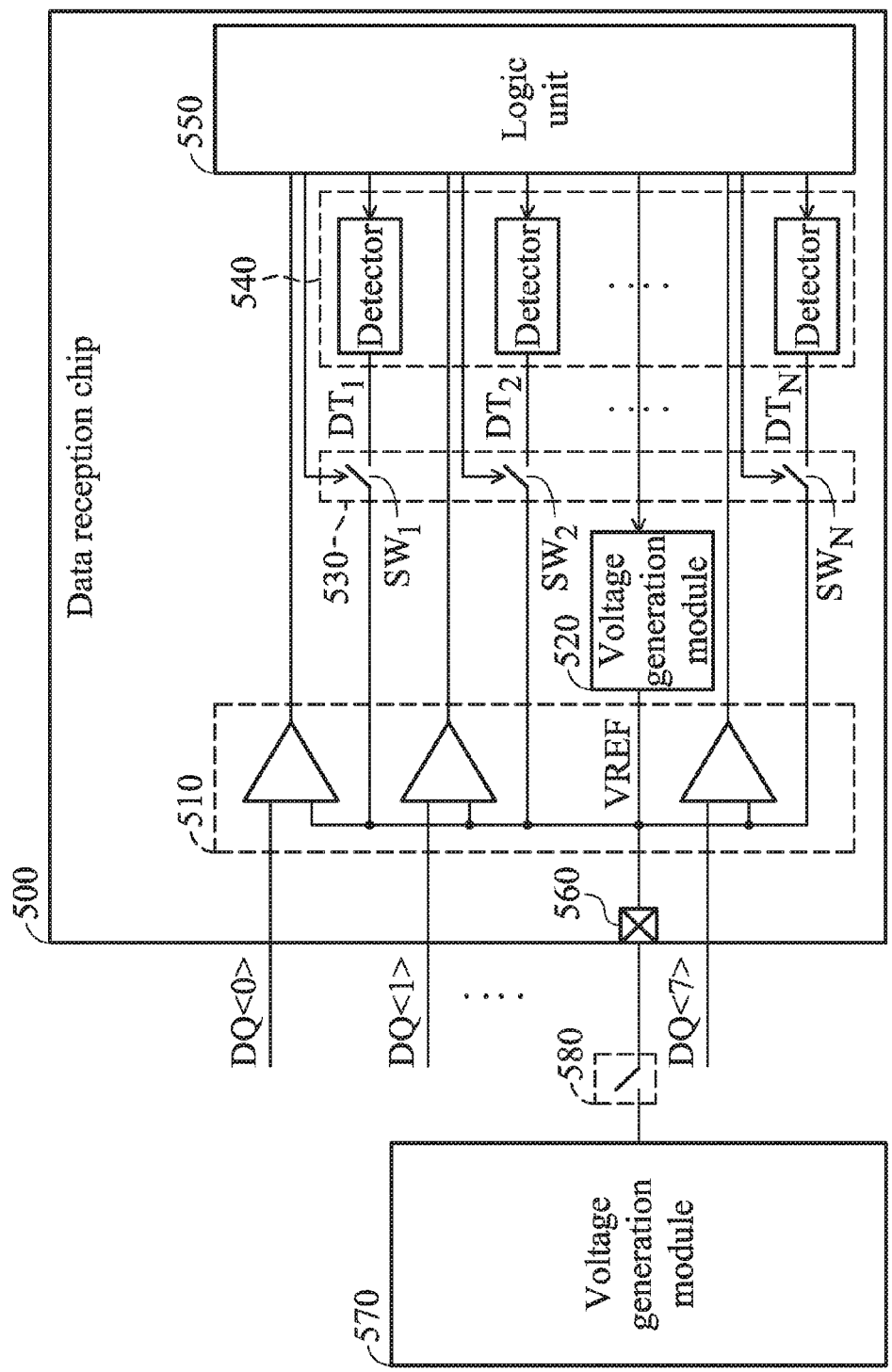
FIG. 5 is a schematic diagram of an exemplary embodiment of a data reception chip, according to various aspects of the present disclosure.

FIG. 5 is a schematic diagram of another exemplary embodiment of a data reception chip, according to various aspects of the present disclosure. The data reception chip 500 comprises a comparison module 510, a voltage generation module 520 and a switching module 530, a detection module 540 and a logic unit 550. In one embodiment, the data reception chip 500 is a memory controller to access an external memory, such as a double-data-rate three synchronous dynamic random access memory (DDR3 SDRAM) or a DDR4 SDRAM.

The comparison module 510 receives data DQ<0>~DQ<7> and compares the data DQ<0>~DQ<7> with a reference voltage VREF, respectively. In one embodiment, the reference voltage is generated by an internal voltage generation module 520 within the data reception chip 500. In another embodiment, the reference voltage VREF is generated by an external voltage generation module 570 outside of the data reception chip 500. In this case, the voltage generation module 570 provides the reference voltage VREF to the comparison module 510 via the test pin 560. The test pin 560 is configured to transmit signals testing the data reception chip 500. In one embodiment, the voltage generation modules 520 and 570 are to be installed simultaneously. In another embodiment, only the voltage generation module 570 is installed outside of the data reception chip 500, and the voltage generation module 570 provides the reference voltage to the data reception chip 500 via a test pin.

For example, when the data DQ<0>~DQ<7> are provided by a DDR3 SDRAM, the switch 580 is turned on to transmit the reference voltage VREF generated by the voltage generation module 570 to the comparison module 510. In one embodiment, the switch 580 is controlled by an external logic unit (not shown). At this time, the voltage generation module 520 is disabled. When the data DQ<0>~DQ<7> are provided by a DDR4 SDRAM, the switch 580 is turned off.

At this time, the voltage generation module 520 is enabled to generate the reference voltage VREF to the comparison module 510.

The switching module 530 is coupled between the comparison module 510 and the detection module 540 to transmit detection signals $DT_1$~$DT_N$. In this embodiment, the switching module 530 comprises switches $SW_1$~$SW_N$. The switches $SW_1$~$SW_N$ are controlled by the logic unit 550. When the switches $SW_1$~$SW_N$ are turned on, the detection signals are transmitted to the test pin 560. In one embodiment, when one of the switches $SW_1$~$SW_N$ is turned on, the other switches are turned off.

The detection module 540 is coupled between the switching module 530 and the logic unit 550 and detects the internal state (e.g. the current, the voltage of the temperature) of the logic unit 550 to generate detection signals $DT_1$~$DT_N$. At least one of the detection signals $DT_1$~$DT_N$ is a current signal, a voltage signal or a temperature signal. In this embodiment, the detection module 540 comprises a plurality of detector, but the disclosure is not limited thereto. In some embodiments, the detection module 540 only comprises a single detector.

In this embodiment, a tester can utilize the test pin 560 to obtain the detection signals $DT_1$~$DT_N$ and determine whether the data reception chip 500 is normal according to the detection signals $DT_1$~$DT_N$. After the tester finishes the test work, the tester provides a turn-off signal to the logic unit 550 to turn off the switching module 530. When the tester wants to test the data reception chip 500, the tester provides a turn-on signal to control the logic unit 550 to turn on the switching module 530.

The invention does not limit the internal structure of the logic unit 550. In one embodiment, the logic unit 550 comprises at least one microprocessor, at least one microcontroller, at least one memory, at least one logic gate. Any circuit structure can be utilized by the logic unit 550, as long as the circuit structure is capable of processing external data. Additionally, since the data reception chip 500 receives the reference voltage VREF generated by the voltage generation module 570 via the test pin 560, the number of pins of the data reception chip 500 can be reduced.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A control method for a data reception chip comprising a voltage generation module comprising a plurality of resistors, a first capacitor, a second capacitor, and a selection unit, wherein the resistors are connected in series with one another and divide an operation voltage to generate a plurality of divided voltages, the first capacitor receives the operation voltage, the second capacitor is serially connected to the first capacitor, and the selection unit selects one of the divided voltages as a reference voltage according to a control signal, comprising:
   controlling the selection unit to set the level of the reference voltage to an initial level;
   receiving data and comparing the data with the reference voltage to generate a compared result;
   determining whether the compared result is equal to pre-determined data; and
   directing the selection unit to select another divided voltage when the compared result is not equal to the pre-determined data.

2. The control method as claimed in claim 1, wherein the initial level is a minimum level among the divided voltages.

3. The control method as claimed in claim 1, wherein the initial level is a maximum level among the divided voltages.

4. The control method as claimed in claim 1, further comprising:
   maintaining the reference voltage when the compared result is equal to the pre-determined data.

5. The control method as claimed in claim 1, further comprising:
   adjusting the reference voltage to fine a plurality of specific divided voltages among the divided voltages when the compared result is equal to the pre-determined data, wherein when the reference voltage is equal to one of the specific divided voltages, the compared result is equal to the pre-determined data.

6. The control method as claimed in claim 5, further comprising:
   averaging the specific divided voltages to generate an averaged value; and
   controlling the selection unit to direct the reference voltage to equal to the averaged value.

7. The control method as claimed in claim 1, wherein the reference voltage has an AC component and a DC component, the first and second capacitors divide the operation voltage to obtain the AC component, and the resistors divide the operation voltage to obtain the DC component.

* * * * *